United States Patent
Baumgartner

(10) Patent No.: US 6,870,864 B2
(45) Date of Patent: Mar. 22, 2005

(54) OPTICAL MARGIN TESTING SYSTEM FOR AUTOMATIC POWER CONTROL LOOPS

(75) Inventor: Steven John Baumgartner, Zumbro Falls, MN (US)

(73) Assignee: International Business Machines Corporation, Armonk, NY (US)

( * ) Notice: Subject to any disclaimer, the term of this patent is extended or adjusted under 35 U.S.C. 154(b) by 247 days.

(21) Appl. No.: 10/058,864

(22) Filed: Jan. 28, 2002

(65) Prior Publication Data

US 2003/0142707 A1 Jul. 31, 2003

(51) Int. Cl.[7] .................................................. H01S 3/13
(52) U.S. Cl. ........................ 372/29.021; 372/29.015; 372/25; 372/38.1
(58) Field of Search ....................... 372/29.021, 29.015, 372/25

(56) References Cited

U.S. PATENT DOCUMENTS

| | | | | |
|---|---|---|---|---|
| 4,377,843 A | * | 3/1983 | Garringer et al. ............. | 710/71 |
| 5,751,764 A | * | 5/1998 | Meyer et al. ................ | 375/219 |
| 5,850,409 A | * | 12/1998 | Link ........................ | 372/38.01 |
| 2002/0014849 A1 | * | 2/2002 | Tsujikawa et al. ........ | 315/169.1 |
| 2003/0052250 A1 | * | 3/2003 | Taguchi ..................... | 250/205 |

* cited by examiner

Primary Examiner—Minsun O. Harvey
Assistant Examiner—Dung T. Nguyen
(74) Attorney, Agent, or Firm—Joan Pennington

(57) ABSTRACT

An optical margin testing system is provided for automatic power control loops. An optical circuit includes a laser diode and a monitor diode coupled to the automatic power control loop. A bias generator circuit generates a control signal. The control signal is applied to the automatic power control loop. The control signal enables an operation point of the laser diode to both increase and decrease by a set percentage value for optical margin testing. The bias generator circuit includes a tri-state receiver. An input signal is applied to the tri-state receiver for selecting one of a normal operational mode, an increased set percentage value operational mode, and a decreased set percentage value operational mode. A current mirror is coupled to the tri-state receiver provides the control signal that is applied to the automatic power control loop.

17 Claims, 2 Drawing Sheets

200

| MARGIN | +X% | -X% | $I_{OUT}/I_{IN}$ |
|---|---|---|---|
| 0 | 0 | 0 | $k * 1$ |
| HIGH Z | 1 | 0 | $k * (1+X\%)$ |
| 1 | 0 | 1 | $k * (1-X\%)$ |

FIG. 2

OPTICAL MARGIN TESTING SYSTEM FOR AUTOMATIC POWER CONTROL LOOPS

FIELD OF THE INVENTION

The present invention relates generally to the data processing field, and more particularly, relates to an optical margin testing system for automatic power control loops.

DESCRIPTION OF THE RELATED ART

During manufacture of products, it is desirable to provide margin testing in order to provide a more reliable product. It is desirable to minimize the number of required test inputs to the product being tested, while executing multiple margin testing functions. It is desirable to implement margin testing without requiring complex software control or readjusting any bias control potentiometers.

For many types of laser-based optical products, typically automatic power control loops are utilized. In optical margin testing for automatic power control loops it is desirable to both increase and decrease the operating point of the light emitting device to validate signal integrity margins. It is desirable to both increase and decrease the operating point of automatic power control loop, for example, by a set percentage threshold to validate signal integrity margins.

A need exists for an optical margin testing system for automatic power control loops. It is desirable to provide such an optical margin testing system for automatic power control loops that provides effective performance and that is simple to implement.

SUMMARY OF THE INVENTION

A principal object of the present invention is to provide an optical margin testing system for automatic power control loops. Another important object of the present invention is to provide such an optical margin testing system for automatic power control loops substantially without negative effect.

In brief, an optical margin testing system is provided for automatic power control loops. An optical circuit includes a laser diode and a monitor diode coupled to an automatic power control loop. A bias generator circuit generates a control signal. The control signal is applied to the automatic power control loop. The control signal enables an operation point of the laser diode to both increase and decrease by a set percentage value for optical margin testing.

In accordance with features of the invention, the bias generator circuit includes a tri-state receiver. An input signal is applied to the tri-state receiver for selecting one of a normal operational mode, an increased set percentage value operational mode, and a decreased set percentage value operational mode. A current mirror is coupled to the tri-state receiver and provides the control signal that is applied to the automatic power control loop.

BRIEF DESCRIPTION OF THE DRAWINGS

The present invention together with the above and other objects and advantages may best be understood from the following detailed description of the preferred embodiments of the invention illustrated in the drawings, wherein:

FIG. 2 is a chart illustrating operation of the optical margin testing system of FIG. 1 including possible values of a margin control input signal applied to a tri-state receiver of the optical margin testing system of FIG. 1 to selectively provide optical margin testing control outputs in accordance with the preferred embodiment.

DETAILED DESCRIPTION OF THE PREFERRED EMBODIMENTS

Figure 1:
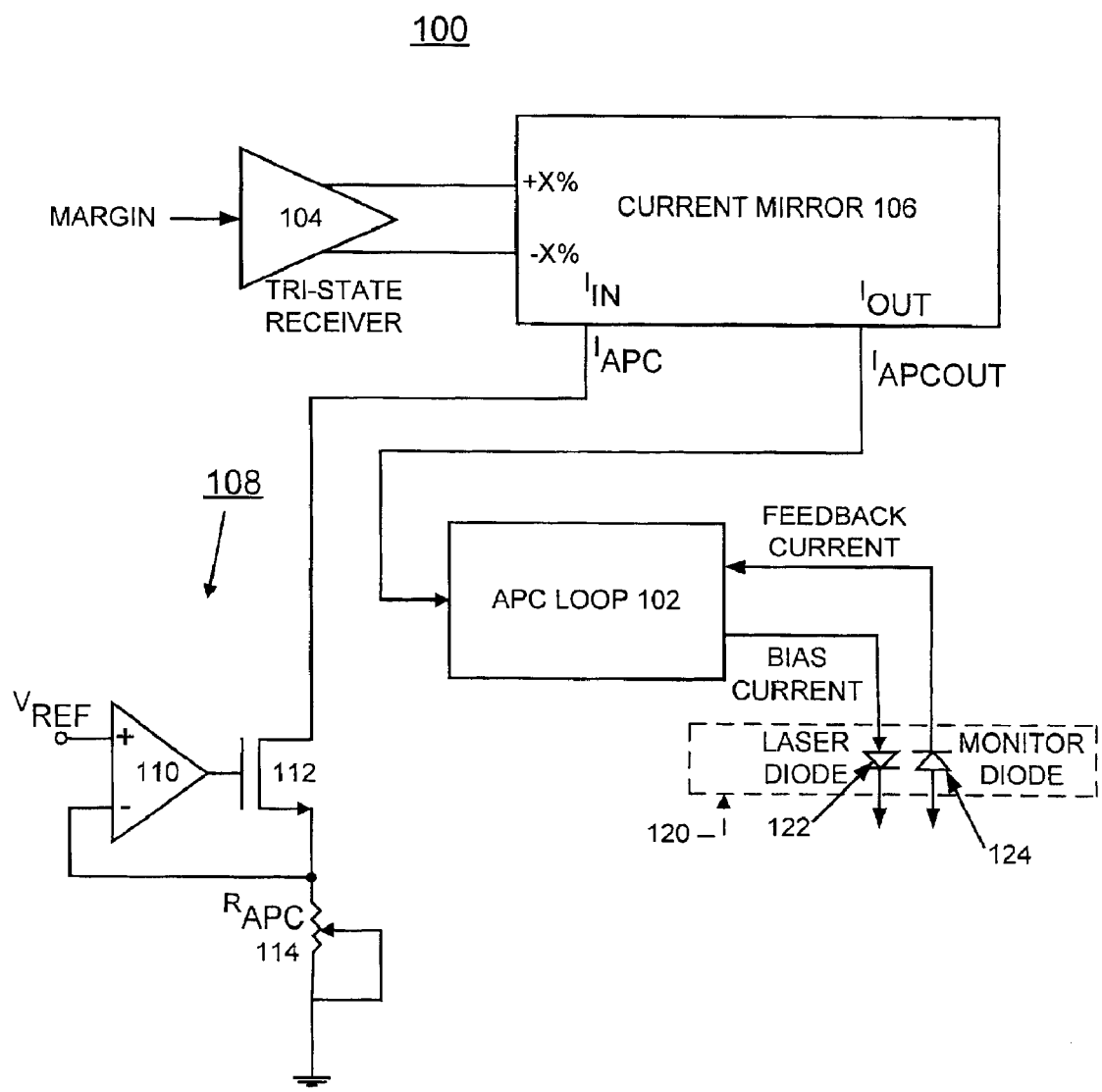
FIG. 1 is a schematic and block diagram illustrating an optical margin testing system for automatic power control loops in accordance with the preferred embodiment.

Having reference now to the drawings, in FIG. 1 there is shown an exemplary optical margin testing system for automatic power control loops in accordance with the preferred embodiment generally designated by the reference character 100. As shown in FIG. 1, optical margin testing system 100 provides a control signal for optical margin testing an automatic power control (APC) loop 102.

In accordance with features of the preferred embodiment, the operating point of the automatic power control loop 102 is shifted without requiring any software control or readjusting any bias control potentiometers. Optical margin testing system 100 effectively implements a 2-bit switched current source into an APC loop 102 so that when the appropriate control signal is provided, the bias generator can increase or decrease the operating point by a defined percentage X%. A single I/O using a tri-state receiver 104 where the three states are normal mode, +X% mode, and −X% mode provides the control signal.

Optical margin testing system 100 includes the tri-state receiver 104 having an input labeled MARGIN. The tri-state receiver 104 is coupled to a programmable current mirror 106 of the optical margin testing system 100.

The MARGIN input is selectively provided as one of zero, high impedance, or one. The MARGIN input is provided as zero for a normal operational mode, as high impedance for an increased +X% operational mode, and as one for a decreased −X% operational mode. A state table of operation of optical margin testing system 100 is illustrated and described with respect to FIG. 2.

Programmable current mirror 106 includes a current input $I_{IN}$ and provides a current output $I_{OUT}$. The current output $I_{OUT}$ is applied to the automatic power control (APC) loop 102 as indicated at a line labeled $I_{APCOUT}$. The current input $I_{IN}$ is applied to the programmable current mirror 106 as indicated at a line labeled $I_{APC}$ by an input current generating circuit generally designated by 108. Input current generating circuit 108 includes an operational amplifier 110 coupled to a gate input of a field effect transistor 112, such as an N-channel field effect transistor (NFET) 112. NFET 112 is connected between the current input $I_{IN}$ of programmable current mirror 106 and a variable resistor $R_{APC}$ 114. A voltage reference $V_{REF}$ is applied to a first input + of operational amplifier 110. The junction connection of NFET 112 and variable resistor $R_{APC}$ 114 is connected to a second input − of operational amplifier 110.

As shown in FIG. 1, input current generating circuit 108 generates the current mirror input bias current $I_{APC}$ by controlling a virtual voltage across the variable resistor 114. The $V_{REF}$ voltage applied to operational amplifier 110 is reflected across the variable resistor $R_{APC}$ 114. This generates the current mirror input bias current $I_{APC}$ that is substantially equal to $V_{REF}/R_{APC}$. This current $I_{APC}$ is mirrored and the mirrored current $I_{APCOUT}$ is applied to the APC loop 102 for comparison with a feedback current to the APC loop 102.

A monitored optical circuit generally designated by 120 includes a laser diode 122 and a monitor diode or photodiode 124. A bias current as indicated at a line labeled BIAS CURRENT is applied to the laser diode 122 via the APC loop 102. The feedback current from the monitor photodiode 124 as indicated at a line labeled FEEDBACK CURRENT is applied to the APC loop 102

In accordance with features of the preferred embodiment, the optical margin testing system 100 implements simple selectable scaled current sources which make use of existing adjustment resistors for optical margin testing. Optical margin testing system 100 provides a single I/O interface to execute the margin testing functions to both increase and decrease the operating point of automatic power control loop 102 by the set percentage threshold X% to validate signal integrity margins. Optical margin testing system 100 delivers an accurate representation of the slight deviation from the normal operating point of the laser diode 122.

Referring also to FIG. 2, the implementation of the invention is contained in the programmable current mirror 106. The state table of operation is illustrated in FIG. 2 and described in the following Table 1. To implement this function, a simple combination of scaled current sources that are selectable by the +x% and -x% control signals will achieve the desired output.

TABLE 1

| Margin | +X % | -X % | $I_{OUT}/I_{IN}$ |
|--------|------|------|------------------|
| 0      | 0    | 0    | k*1              |
| HighZ  | 1    | 0    | k*(1 + X %)      |
| 1      | 0    | 1    | k*(1 - X %)      |

Optical margin testing system 100 enables effective margin testing of a product including monitored optical circuit 120 before sending the product out into the field. Optical margin testing system 100 enables the operating point of the light emitting device 122 to be skewed slightly to validate signal integrity margins effected by modulating near the threshold or near the Pmax (maximum power due to saturation of optical assembly) of the light emitting device. The +X% is small enough to be contained under the laser eye safety limits but large enough to provide a sufficient stress of the laser device 122.

An advantage of the optical margin testing system 100 is that a fixed value of the variable resistor 114 is used. This is a significant improvement over testing arrangements that require changing a variable resistor or potentiometer value to skew an operating point for an optical circuit being tested.

It should be understood that the present invention is not limited to the exemplary optical margin testing system 100 including the programmable current mirror 106 as shown in FIG. 1. For example, scaled voltage sources, for example, multiplexed to the $V_{REF}$ node, could be used to both increase and decrease the operating point of automatic power control loop 102 by the set percentage threshold X% to validate signal integrity margins.

While the present invention has been described with reference to the details of the embodiments of the invention shown in the drawing, these details are not intended to limit the scope of the invention as claimed in the appended claims.

What is claimed is:

1. An optical margin testing system for an automatic power control loop comprising:

an optical circuit including a laser diode and a monitor diode coupled to said automatic power control loop;

a bias generator circuit for generating a control signal; said control signal applied to said automatic power control loop;

said control signal enabling an operation point of said laser diode to both increase and decrease by a set percentage value; and said bias generator circuit for generating said control signal including a tri-state receiver; a single input applied to said tri-state receiver, said single input having a selected value of zero, high impedance, or one.

2. An optical margin testing system for an automatic power control loop comprising:

an optical circuit including a laser diode and a monitor diode coupled to said automatic power control loop;

a bias generator circuit for generating a control signal; said control signal applied to said automatic power control loop; said bias generator circuit for generating said control signal including a tri-state receiver;

said control signal enabling an operation point of said laser diode to both increase and decrease by a set percentage value; and said tri-state receiver receiving an input signal; said input signal being applied to said tri-state receiver for selecting one of a normal operational mode, an increased set percentage value operational mode, and a decreased set percentage value operational mode.

3. An optical margin testing system for an automatic power control loop as recited in claim 2 wherein said bias generator circuit for generating said control signal includes a current mirror coupled to said tri-state receiver.

4. An optical margin testing system for an automatic power control loop as recited in claim 3 wherein said current mirror provides said control signal applied to said automatic power control loop.

5. An optical margin testing system for an automatic power control loop as recited in claim 2 wherein said automatic power control loop applies a bias current to said laser diode responsive to said control signal.

6. An optical margin testing system for an automatic power control loop as recited in claim 2 wherein said monitor diode coupled to said automatic power control loop provides a feedback current to said automatic power control loop.

7. An optical margin testing system for an automatic power control loop as recited in claim 3 wherein said bias generator circuit for generating said control signal includes an input current generating circuit coupled to said current mirror.

8. An optical margin testing system for an automatic power control loop as recited in claim 7 wherein said input current generating circuit includes a variable resistor having a value represented by $R_{APC}$; said variable resistor reflecting a voltage reference value $V_{REF}$ for generating an input current applied to said current mirror.

9. An optical margin testing system for an automatic power control loop as recited in claim 8 wherein said input current applied to said current mirror is substantially equal to $V_{REF}/R_{APC}$.

10. An optical margin testing system for an automatic power control loop as recited in claim 8 wherein said input current generating circuit includes an operational amplifier coupled to said variable resistor and wherein said voltage reference value $V_{REF}$ is applied to said operational amplifier.

11. An optical margin testing system for an automatic power control loop comprising:

an optical circuit including a laser diode and a monitor diode coupled to said automatic power control loop;

a tri-state receiver;

a current mirror coupled to said tri-state receiver for generating a control signal; said control signal applied to said automatic power control loop; said control signal enabling an operation point of said laser diode to both increase and decrease by a set percentage value; and an input signal being applied to said tri-state receiver for selecting one of a normal operational mode, an increased set percentage value operational mode, and a decreased set percentage value operational mode.

12. An optical margin testing system for an automatic power control loop as recited in claim 11 wherein said automatic power control loop applies a bias current to said laser diode responsive to said control signal.

13. An optical margin testing system for an automatic power control loop as recited in claim 11 wherein said monitor diode coupled to said automatic power control loop provides a feedback current to said automatic power control loop responsive to said control signal.

14. An optical margin testing system for an automatic power control loop as recited in claim 11 includes an input current generating circuit coupled to said current mirror.

15. An optical margin testing system for an automatic power control loop as recited in claim 14 wherein said input current generating circuit coupled to said current mirror includes a variable resistor having a value represented by $R_{APC}$; said variable resistor reflecting a voltage reference value $V_{REF}$ for generating an input current applied to said current mirror.

16. An optical margin testing system for an automatic power control loop as recited in claim 15 wherein said input current applied to said current mirror is substantially equal to $V_{REF}/R_{APC}$.

17. An optical margin testing system for an automatic power control loop as recited in claim 15 wherein said input current generating circuit includes an operational amplifier coupled to said variable resistor and wherein said voltage reference value $V_{REF}$ is applied to said operational amplifier.

* * * * *